(12) United States Patent
Jahnke

(10) Patent No.: US 9,141,488 B1
(45) Date of Patent: Sep. 22, 2015

(54) RUN-TIME RECOVERY OF MALFORMED INTERCONNECT RESPONSE

(71) Applicant: Altera Corporation, San Jose, CA (US)

(72) Inventor: Steve Jahnke, Allen, TX (US)

(73) Assignee: Altera Corporation, San Jose, CA (US)

( * ) Notice: Subject to any disclaimer, the term of this patent is extended or adjusted under 35 U.S.C. 154(b) by 116 days.

(21) Appl. No.: 14/100,841

(22) Filed: Dec. 9, 2013

(51) Int. Cl.
*G06F 11/00* (2006.01)
*G06F 11/20* (2006.01)

(52) U.S. Cl.
CPC .................................. *G06F 11/2002* (2013.01)

(58) Field of Classification Search
USPC .......................................................... 714/5.1
See application file for complete search history.

(56) References Cited

U.S. PATENT DOCUMENTS

| | | | |
|---|---|---|---|
| 6,985,980 B1 * | 1/2006 | Allegrucci | 710/107 |
| 7,111,213 B1 * | 9/2006 | Dastidar et al. | 714/724 |
| 7,478,299 B2 * | 1/2009 | Brandyberry et al. | 714/727 |
| 9,003,246 B2 * | 4/2015 | Mozak et al. | 714/718 |

OTHER PUBLICATIONS

Qsys Interconnect 8, Q1151021, ISO 9001-2008 Registered, ALTERA®, pp. 8-1-8-60, Nov. 4, 2013.
U.S. Appl. No. 13/938,014, filed Jul. 9, 2013 entitled "Protocol Error Monitoring on an Interface Between Hard Logic and Soft Logic".

* cited by examiner

*Primary Examiner* — Sarai Butler
(74) *Attorney, Agent, or Firm* — Weaver Austin Villeneuve & Sampson LLP

(57) ABSTRACT

Various embodiments of the present disclosure provide techniques for monitoring one or more transactions output from a configurable logic system (CLS) to a hard logic system. The CLS and the hard logic system are communicatively coupled by a bridge. The hard logic system receives an exception indicating that a malformed interconnect response has been output by the CLS, clears all pending CLS transactions, isolating the CLS, and executes a run-time recovery process. The run-time recovery process may include reading an interconnect register to obtain an offending address, within the CLS, associated with the malformed interconnect response, and logging the offending address into a system log.

20 Claims, 6 Drawing Sheets

RUN-TIME RECOVERY OF MALFORMED INTERCONNECT RESPONSE

TECHNICAL FIELD

The present disclosure generally relates to integrated circuits and, more particularly, to techniques for recovering, at run-time, from a malformed interconnect response.

BACKGROUND

A programmable logic device (PLD) is a semiconductor integrated circuit that contains logic circuitry that can be programmed to perform a host of logic functions. Characteristically, a PLD includes configurable ("soft") logic. In a typical scenario, a designer uses electronic design automation (EDA) tools to create a design (i.e., configure the soft logic). These tools use information regarding the hardware capabilities of a given programmable logic device to help the designer implement the custom logic circuit using multiple resources available on that given programmable logic device.

An example of a PLD that may benefit from the presently disclosed design tools and techniques include a field programmable gate array (FPGA) and, particularly an FPGA configured within an integrated system on a chip (SOC). In some systems, a PLD may interface with a fixed logic device such as an application specific integrated circuit (ASIC), structured ASIC, processor, or other device. Accordingly, the soft logic of the PLD may interact with the fixed logic (or hard logic) of the ASIC. Additionally, a single device may include both hard logic and soft logic. For example, a device may include a hardened processor system (i.e., hard logic) and configurable logic (i.e., soft logic). In some systems, a PLD may communicate with a memory and/or one or more peripherals using a high-performance interconnect (HPI) such as, for example, the AXI bus from ARM Holdings. To enable proper communication between the circuitry implemented in the hard logic and the soft logic, a particular protocol may be followed.

An HPI may ordinarily be architected to assume that all peripherals have been fully validated and will return proper responses. In a PLD configured within an SOC, however, the PLD may be directly connected to a fixed logic device by way of the HPI. Since the fixed logic device designers have no control over how the end-user will program the PLD, it cannot be assumed that all logic will now return a proper interconnect response. When a malformed interconnect response is received, the default action may be to trigger a watchdog error. Such watchdog errors are "catastrophic" from the processor/software viewpoint, because they cause an immediate reset.

As a result, improved techniques to manage how a malformed response is handled in software are desirable.

SUMMARY OF INVENTION

The presently disclosed techniques permit recovery, at run-time, from a malformed interconnect response. More particularly, a system including soft logic and hard logic is shutdown gracefully and/or reinitiated while, preferably, avoiding a watchdog event or other hard shutdown.

In some implementations, one or more transactions output from a configurable logic system (CLS) to a hard logic system are monitored, the CLS and the hard logic system being communicatively coupled by a bridge. The hard logic system receives an exception indicating that a malformed interconnect response has been output by the CLS, clears all pending CLS transactions, isolating the CLS, and executes a run-time recovery process. The run-time recovery process may include reading an interconnect register to obtain an offending address, within the CLS, associated with the malformed interconnect response, and logging the offending address into a system log.

In some implementations, an electronic circuit for monitoring transactions between a hard logic system and a configurable logic system (CLS), the CLS and the hard logic system being communicatively coupled by a bridge is configured to receive an exception, the exception indicating that a malformed interconnect response has been output by the CLS. The electronic circuit may be configured to clear all pending CLS transactions, isolate the CLS, and execute a run-time recovery process.

These and other features will be presented in more detail in the following specification of the invention and the accompanying figures, which illustrate by way of example the principles of the invention.

BRIEF DESCRIPTION OF THE DRAWINGS

The included drawings are for illustrative purposes and serve only to provide examples of possible implementations of the disclosed inventive techniques. These drawings in no way limit any changes in form and detail that may be made by one skilled in the art without departing from the spirit and scope of the disclosed implementations.

Figure 1:
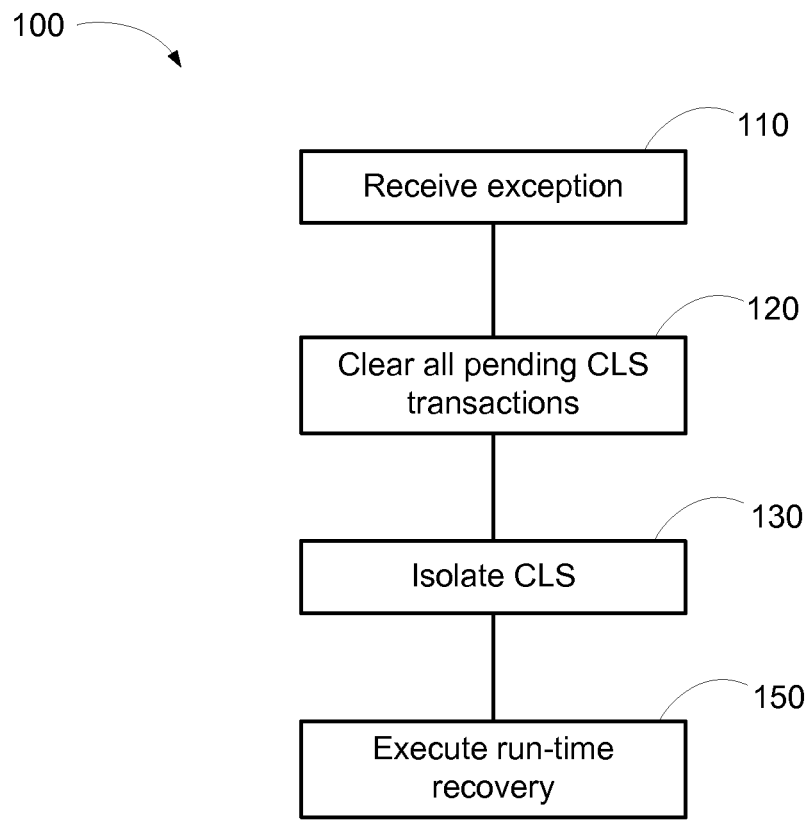
FIG. 1 is a process flow diagram illustrating an implementation of the presently disclosed techniques.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

The presently disclosed techniques are primarily described with reference to PLDs such as FPGAs, but is not necessarily limited to PLDs.

As disclosed herein, the techniques may be implemented in hard logic and soft logic in a variety of configurations. Both hard logic and soft logic may be on a single device. Additionally, hard logic and soft logic may be on separate devices or chips. For example, a device may include a hardened processor system (i.e., hard logic) and configurable logic (i.e., soft logic) on a single chip. Alternatively, an ASIC (i.e., hard logic) with particular functionality may interface with configurable logic of an FPGA (i.e., soft logic). In other implementations, a device in hard logic may communicate through an interface, also in hard logic, to another device also configured in hard logic. A device in soft logic may communicate through an interface, also in soft logic, to another device also configured in soft logic. Moreover, a device in hard logic may communicate to another device in hard logic through an interface in soft logic. A device in soft logic may communicate to another device in soft logic through an interface in hard logic.

Referring now to FIG. 1, a process flow diagram illustrating an implementation of the present techniques is illustrated. Method 100 may begin at block 110, by receiving an exception at a monitor. The exception may indicate an error condition. Examples of error conditions within the contemplation of the present disclosure are described herein below. In some implementations, the exception may indicate existence of a malformed interconnect response between a configurable logic system (CLS) and a hard logic system. In some implementations, the hard logic system may be, or include, a hard processor system (HPS) or an application specific integrated circuit (ASIC) designed for a particular functionality. The CLS may be, or include, a PLD, for example. The CLS may be configured in accordance with a binary bitstream file (referred to hereinbelow, as the "first binary configuration file").

Examples of a malformed interconnect response may include (1) a response packet that does not occur within a specified time window; (2) an unexpected response packet with unknown ID; (3) incorrect burst length corresponded to READ response; or (4) Data ID and address ID ordering mismatch for a WRITE transaction.

In some implementations, block 110 may be executed by the hard logic system, which may be monitoring one or more transactions output from the CLS to the hard logic system. The CLS and the hard logic system may be communicatively coupled by a bridge, for example.

In some implementations, the hard logic system may include a protocol monitoring unit and a master, while the CLS includes a slave, as described in more detail in U.S. patent application Ser. No. 13/938,014, entitled "Protocol Error Monitoring on an Interface Between Hard Logic and Soft Logic, filed Jul. 9, 2013, assigned to the assignee of the present application, the disclosure of which is hereby incorporated into the present application in its entirety. The protocol monitoring unit may be configured to receive a first transaction addressed to the slave, the first transaction being received from the master, and to receive a first return transaction from the CLS. The protocol monitoring unit may make a determination that an error has occurred in the configurable logic system and transmit an error message, for example, the "exception" to the master. The protocol monitoring unit, in some implementations, may be realized as soft IP within the CLS. In such implementations, the protocol monitoring unit may be configurable such that different protocols may be tried in the event of an erroneous response in an attempt to find a protocol that works without generating errors.

Referring still to FIG. 1, at block 110, the hard logic system may clear all pending CLS transactions. For example, the hard logic system may run an exception handler from any memory location outside the CLS. The hard logic system may be, or include, an SOC processor.

At block 130, the hard logic system may isolate the CLS. For example the exception handler may turn off the bridge communicatively coupling the CLS and the hard logic system. Advantageously, isolating the CLS will block off communications with the CLS from any source outside the CLS. In some implementations, the example the exception handler may turn off the bridge at run-time, without requiring a recompile process.

At block 150, the hard logic system may initiate a run-time recovery process. Advantageously, the run-time recovery process avoids triggering a watchdog event or other hard shutdown. In some implementations, the run-time recovery process permits shutting down the CLS gracefully and/or reenabling the CLS.

Advantageously blocks 110, 120, 140 and 150 may each executed by software run from memory external to the CLS. For example, the memory may be integrated with and/or communicatively coupled to the SOC processor.

Figure 2:
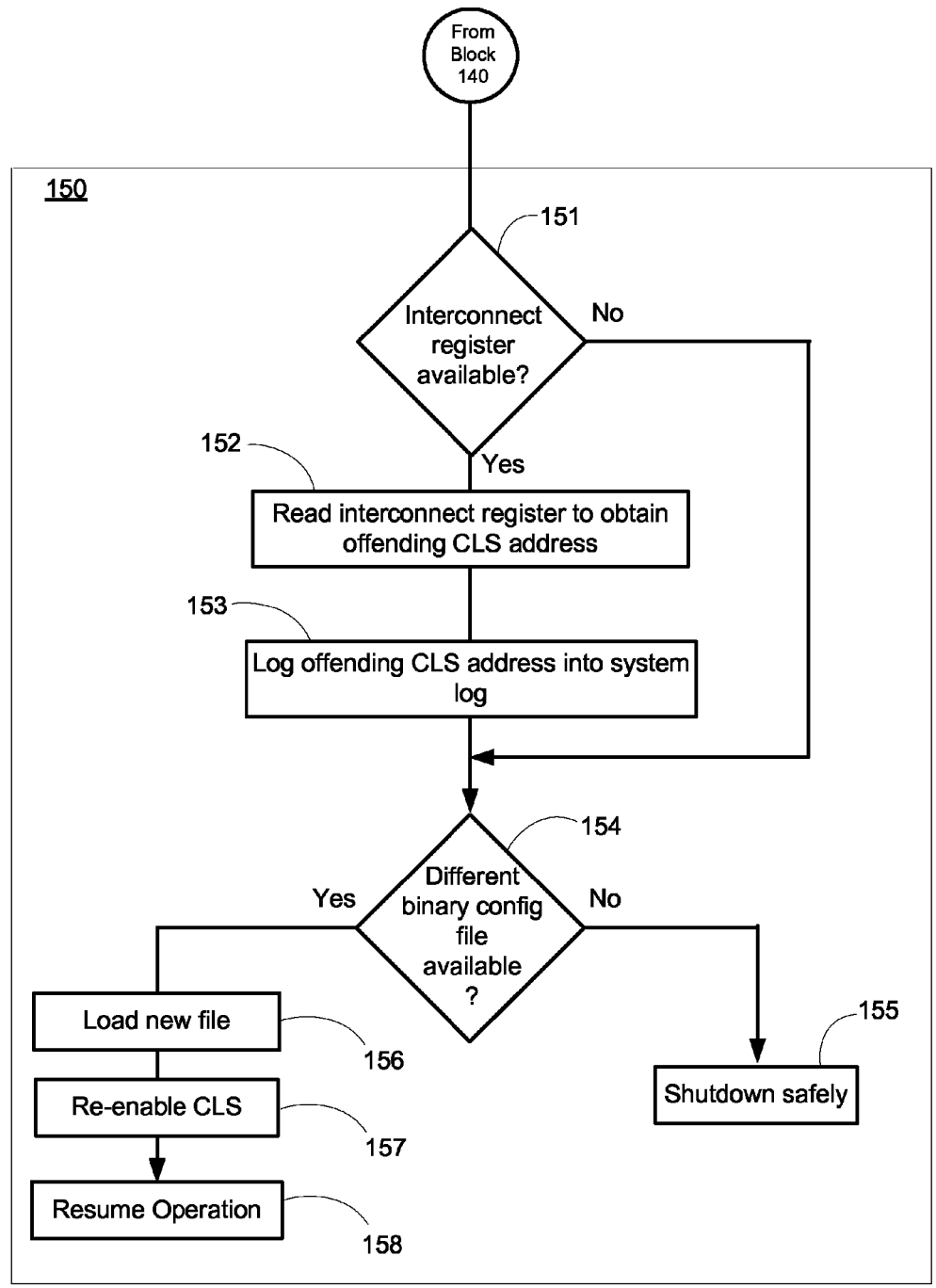
FIG. 2 is a process flow diagram illustrating a further implementation.

Certain features of the run-time recovery process may be better appreciated by referring now to FIG. 2. In some implementations, executing the run-time recovery process at block 150 may start at block 151 with making a determination whether an interconnect register is available to the hard logic system. For example, the interconnect register may be stored in a memory available to the SOC processor. If the interconnect register is not available, the method may proceed to block 154, described below.

If the interconnect register is available, the method may proceed to block 152. At block 152, an offending CLS address, associated with the malformed interconnect response, may be obtained by reading the interconnect register.

At block 153, the offending CLS address may be logged into a system log, for example a log accessible by the hard logic system. By logging the offending address, diagnostic information regarding the malformed interconnect response may be preserved for analysis by a user and/or designer of the CLS.

When the interconnect register is not available, or after logging the offending CLS address into the system log, the method may proceed to block 154. At block 154, a determination may be made as to whether or not a second binary configuration file, different from the first binary configuration file, is available to the hard logic system. In some implementations, the second binary configuration file may be a Programmer Object File (POF). Advantageously, the second binary configuration file may be stored in a memory associated with and/or communicatively coupled to the hard logic system. For example, the second binary configuration file may be stored in a nonvolatile memory accessible by the SOC processor.

When a determination is made at block 154 that the second binary configuration file is available, the second binary configuration may be loaded, at block 156, onto the CLS. For example, where the CLS includes a PLD, the PLD may be completely reconfigured by virtue of loading the second binary configuration file onto the CLS. In some implementations, block 156 may be preceded by an input/output (I/O) interaction (not illustrated) with a user. For example, the HLS may output a message to the user that one or more different binary configurations are available, and the user may be provided the opportunity to input whether the user wishes a user-selected one of the different binary configurations to be loaded onto the CLS.

At block 157, the CLS may be re-enabled, following which operation of the CLS and hard logic system may resume, block 158.

When a determination is made at block 154 that the second binary configuration file is not available, the hard logic system may cause the CLS to be safely shutdown, block 155.

Figure 3:
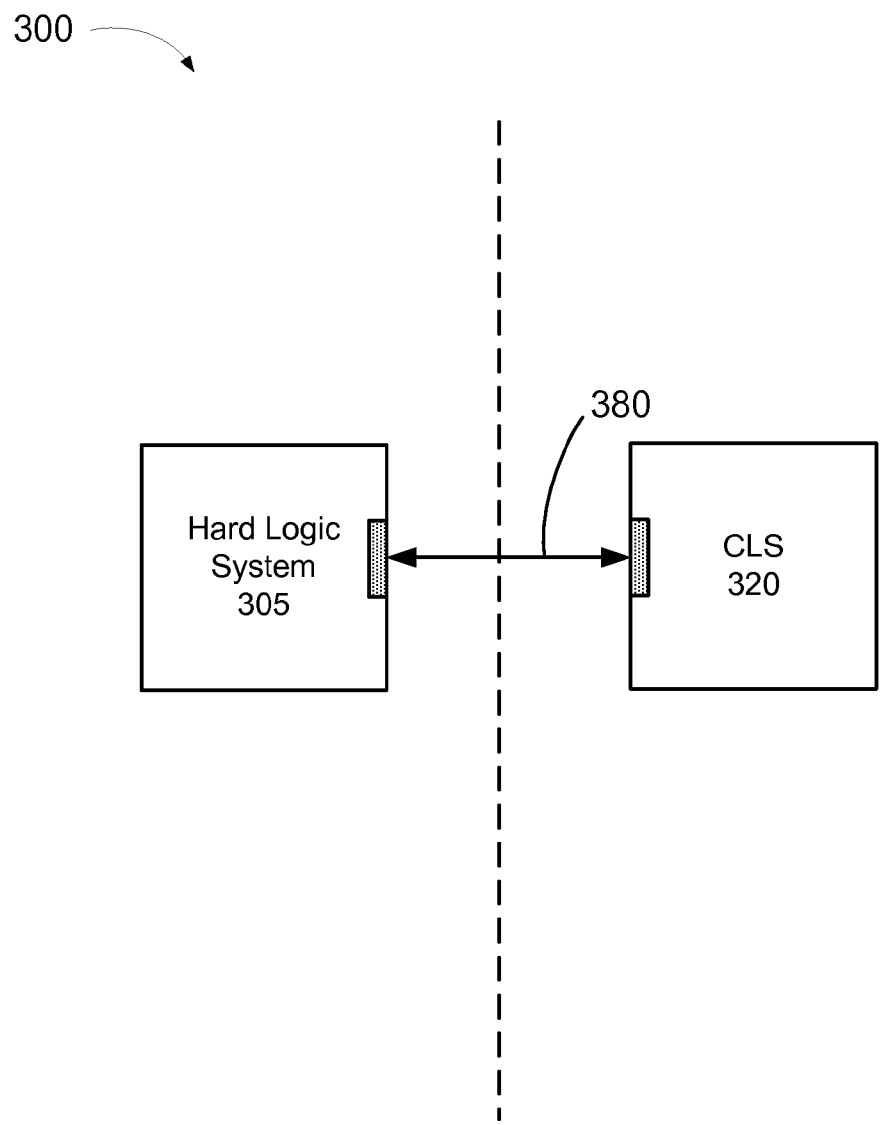
FIG. 3 illustrates an example of a computer system configured to enable recovering, at run-time, from a malformed interconnect response.

Referring now to FIG. 3, an example of a computer system 300 configured to enable recovering, at run-time, from a malformed interconnect response will be described. The illustrated system includes hard logic system 305, communicatively coupled by way of bridge 380 to CLS 320. In the implementation of FIG. 3, hard logic system 305 may include, for example, a hardened system-on-a-chip (SOC) logic. In some implementations, hard logic system 305 may be, or include, a hard processor system (HPS) or an application specific integrated circuit (ASIC) designed for a particular functionality.

Hard logic system 305 may be configured to communicate with CLS 320. In an implementation, CLS 320 may be programmed or configured with a binary configuration file (the "first binary configuration file), such as a binary configuration file suitable for programming a field programmable gate array (FPGA). For example, a variety of memories or other peripherals may be instantiated within the configurable logic of the CLS 320. It will be appreciated, therefore, that bridge 380 from hard logic system 305 to CLS 120 may couple a device (not illustrated) on hard logic system 305 to a device (not illustrated) on CLS 120.

In some implementations, bridge 180 may rely upon a protocol. For example, hard logic system 305 and CLS 320 may communicate with each other using Advanced eXtensible Interface (AXI), Avalon, or other protocols that may be used to communicate data between devices on an FPGA fabric and HPS logic.

Figure 4:
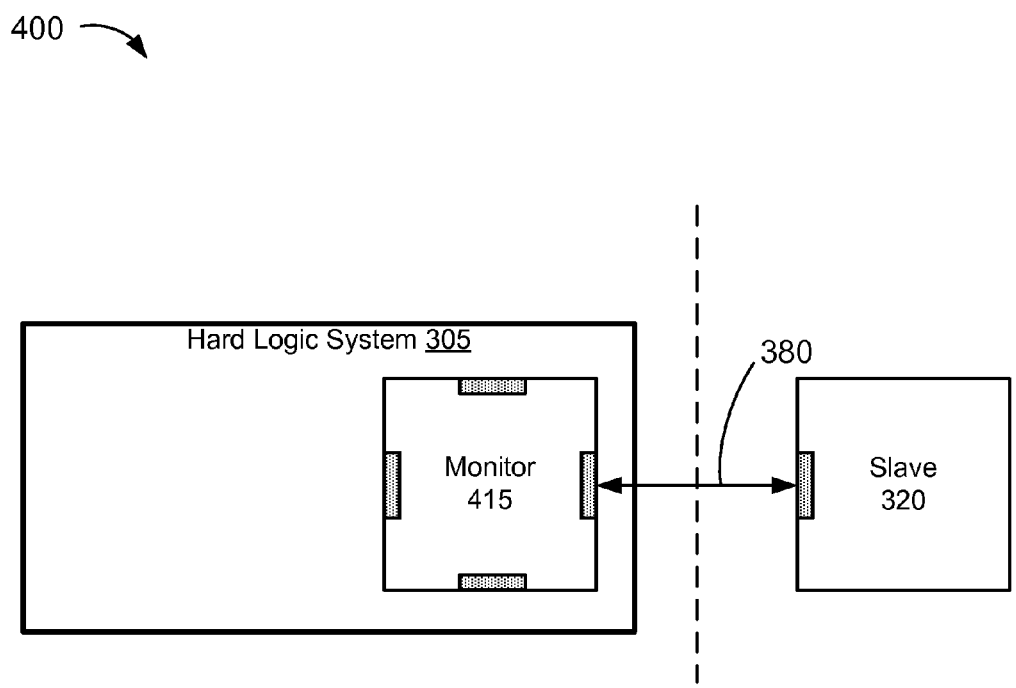
FIG. 4 illustrates a further example of a computer system configured to enable recovering, at run-time, from a malformed interconnect response.

Referring now to FIG. 4, an example implementation is illustrated wherein hard logic system 305 includes a monitoring circuit (monitor) 415. In some implementations, monitor 415 may monitor communications and, ensure proper use of specified protocols for multiple devices within hard logic system 305 and CLS 320. Moreover, monitor 415 may be configured so that when monitor 415 receives an exception, the exception indicating that a malformed interconnect response has been output by CLS 320, monitor 415 may clear all pending transactions relating to CLS 320. In addition monitor 425 may isolate CLS by, for example, closing bridge 380 between CLS 320 and hard logic system 305. Finally monitor 415 may be configured to execute a run-time recovery process that, advantageously, avoids triggering a watchdog event or other hard shutdown.

The run-time recovery process may include execution of one or more of the process blocks illustrated in FIG. 2. For example, monitor 415 may make a determination whether an interconnect register is available to the hard logic system 305.

If the interconnect register is available, monitor 415 may obtain an offending CLS address, associated with the malformed interconnect response and log the CLS address into a system log, for example a log accessible by hard logic system 305.

If the interconnect register is not available, or after logging the offending CLS address into the system log, monitor 415 may make a determination as to whether or not a second binary configuration file, different from the first binary configuration file, is available to hard logic system 305.

Of the second binary configuration file is available, monitor 415 may cause the second binary configuration to be loaded onto CLS 320 and cause CLS 320 to be re-enabled, following which operation of CLS 320 and hard logic system 305 may resume.

When a determination is made at block 154 that the second binary configuration file is not available, monitor 415 may cause the CLS to be safely shutdown, block 155.

Figure 5:
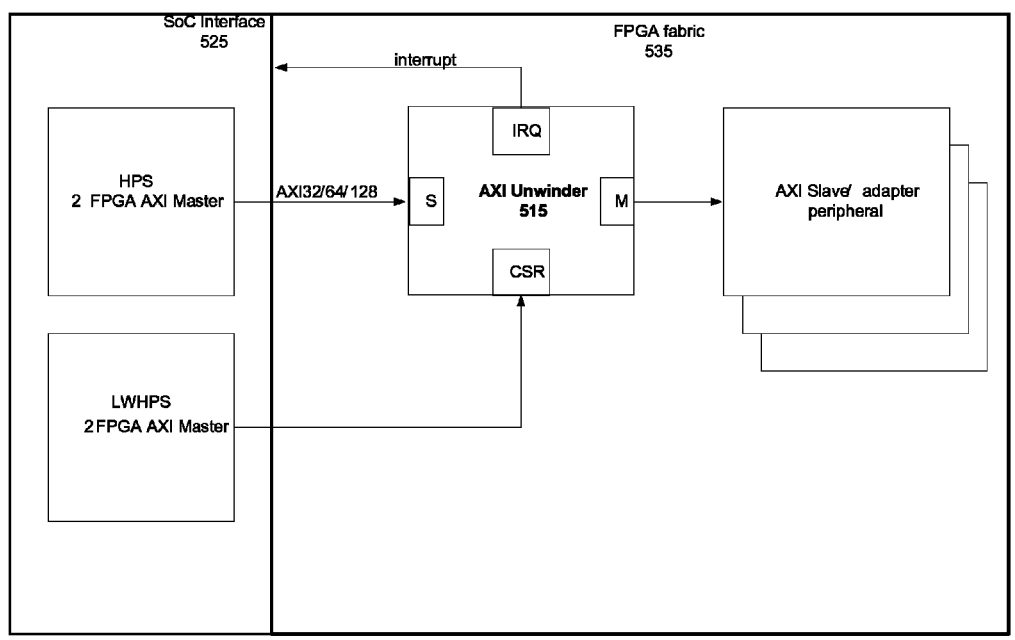
FIG. 5 illustrates an example of a monitoring circuit suitable for use in detecting a malformed interconnect response.

Referring now to FIG. 5, a further example of an implementation will be described. In the illustrated implementation, monitoring circuit, which may be referred to as the AXI Unwinder IP 515 is disposed between SoC AXI Interface 525 and the FPGA AXI Interfaces 535 of any peripheral logic implemented in FPGA. Advantageously, one AXI Unwinder IP 515 may be applied to a single AXI bus between SoC AXI Interface 525 and FPGA fabric 535. In the illustrated implementation a user may be enabled to instantiate the AXI Unwinder IP 515 into the user's FPGA design. AXI Unwinder IP 515 may monitor each AXI transaction request and may ignore the transaction when the said transaction is completed with response.

In some implementations, AXI Unwinder IP 515 may be operable to monitor AXI traffic and may perform one or more of the following checks described in greater detail herein below: (1) AXI response packet does not occur within a specified time window; (2) Unexpected response packet with unknown ID; (3) Incorrect burst length corresponded to READ response; (4) Data ID and address ID ordering mismatch for a WRITE transaction.

In some implementations, AXI Unwinder IP 515 may allow AXI transaction with out-of-order response and no checking on response ordering may be carried out. This may include observing multiple slaves that may be connected to an AXI Master Interface with a Qsys interconnect, for example, and each of the slaves may have a different response latency.

Upon detection of an erroneous transaction, the AXI Unwinder IP 515 may issue the "slave error" (SLVERR) response for any new transaction request, at the same time allow existing transactions to be completed As indicated above, AXI Unwinder IP 515 may perform a check of whether an AXI response packet does not occur within a specified time window. More particularly, in some implementations, a component parameter of timeout period for an AXI transaction may be determined by a system designer during generation time. Advantageously, this timeout period to be smaller than the SoC watchdog timeout period. Determination of the timeout may, advantageously, include the transaction latency of SoC internal logic such as L3 Interconnect NIC301 and AXI Bridges.

When an AXI transaction request is received by, for example, an AXI Slave Interface of AXI Unwinder IP 515, the transaction ID may be captured and tagged with a countdown timer. The countdown timer may start counting down until its respond packet is completed at, for example, an AXI Master Interface of the AXI Unwinder IP 515. In an event where the countdown timer reaches zero, the outstanding transaction may be considered to be expired.

Upon expiration of an outstanding transaction, parameters, such as a transaction ID, destination address, burst type, burst length and data size may be captured into status registers, associated error flag may be set and level high interrupt may be issued. In parallel, an emulated SLVERR response may be generated and sent back to an upstream AXI Master Interface. When the actual delayed response of the overdue transaction is received at AXI Unwinder, the actual delayed response may be dropped.

As indicated above, AXI Unwinder IP 515 may perform a check for presence of an unexpected response packet with unknown ID. An AXI response packet may be considered unexpected if a request transaction with the same ID is never received. AXI Unwinder IP 515 may drop this unexpected response packet, and store the transaction ID. An associated error flag may be set and a level interrupt may be issued.

As further indicated above, AXI Unwinder IP 515 may perform a check for incorrect burst length corresponded to READ response. It will be appreciated that a number of data beats must match the burst length value in a transaction, or else it may result in an AXI protocol violation.

For READ response transaction with shorter than expected length, the AXI Unwinder IP 515 may remove the last beat "LAST" information and extend the beat up to the burst length as specified in an associated read request transaction. Any modified or extended beat may be associated with a SLVERR response.

For a READ transaction with a longer than expected length, the AXI Unwinder IP 515 may insert "LAST" information at the expected last beat, and drop the subsequence response beats of the same ID. Any modified or extended beat may be associated with SLVERR response.

As indicated above, AXI Unwinder IP 515 may perform a check for data ID and address ID ordering mismatch for a WRITE transaction. More particularly, AXI Unwinder IP 515 may check if a W channel and an AW channel transaction ID both have the same order. Any mismatch ID ordering may be considered as AXI protocol violation. Upon receipt of interrupt with un-ordered transaction, the erroneous transaction sender system may be located.

In some implementations, the AXI bus may include a bridge that will pass everything it receives from a host/master of the CLS to one or more peripherals of the SOC. In such implementations, filtering or checking of AXI protocol correctness by the bridge may be avoided.

In some implementations, the monitor may include a software module (referred to herein above as the "AXI Unwinder IP") that may provide alternative notification to the SoC processor for any AXI packet error the monitor detects. The AXI Unwinder IP may handle an overdue request of an AXI transaction to avoid system hang that may result from FPGA logic behaving incorrectly. Such an overdue request may otherwise cause a catastrophic reset by the watchdog timer.

In some implementations, an emulated error response may be generated by the AXI Unwinder IP to an affected AXI master interface before the watchdog timer expired. Advantageously, the AXI Unwinder IP may also extend minimum protocol checking on an AXI response packet, and unwind the packet if necessary. These implementations may provide flexibility to the SoC processor in managing of erroneous response from an AXI interface due to any potential violation/error in CLS logic.

The AXI Unwinder may further detect if WRITE data interleaving has happened for an AXI transaction. No correction is necessarily carried out, however. Upon detection of data interleaving, the transaction ID may be captured, and an associated flag may be set and an interrupt may be issued.

In some implementations, the AXI Unwinder may be operable to monitor up to a fixed limit of outstanding READ and RIGHT AXI transactions. Such a fixed number of monitored transactions may be configured during IP generation. However, if total outstanding transactions reach the configured number of monitored transactions, the AXI Unwinder may backpressure any incoming transaction via, for example, an AXI Slave Interface.

Figure 6:
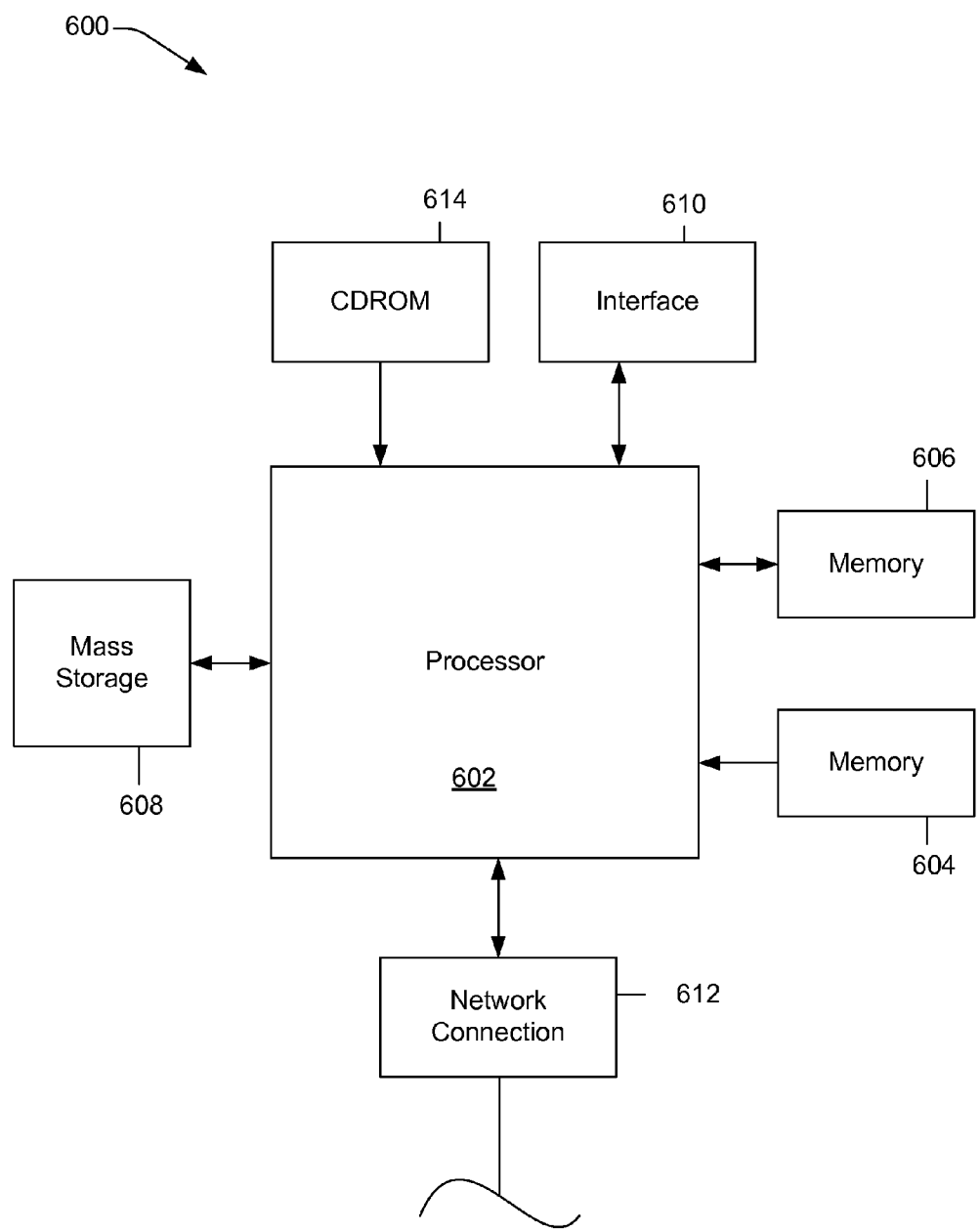
FIG. 6 illustrates a further example of a computer system configured to enable recovering, at run-time, from a malformed interconnect response.

FIG. 6 illustrates one example of a computer system suitable for executing the above-described techniques. The computer system 600 includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate an electronic design. As is well known in the art, memory 504 acts to transfer data and instructions uni-directionally to the CPU and memory 606 are used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network connection as shown generally at 612. With such a network connection, it is contemplated that the CPU might receive information from the network, or might output information to the network in the course of performing the above-described process steps. It should be noted that the system 600 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, a data processing apparatus.

If implemented in software, the functions may be stored as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may be non-transitory and may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Thus, improved automated techniques for recovery from a malformed interconnect response have been disclosed.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A method comprising:
monitoring one or more transactions output from a configurable logic system (CLS) to a hard logic system, the CLS and the hard logic system being communicatively coupled by a bridge; and, with the hard logic system:
receiving an exception, the exception indicating that a malformed interconnect response has been output by the CLS;
clearing all pending CLS transactions;
isolating the CLS; and
executing a run-time recovery process.

2. The method of claim 1, wherein receiving the exception comprises receiving the exception at an exception handler located in a memory location accessible to the hard logic system irrespective of whether the bridge is open.

3. The method of claim 2, wherein the exception handler is located in or proximate to the hard logic system.

4. The method of claim 1, wherein the CLS comprises a programmable logic device.

5. The method of claim 1, wherein the hard logic system is a bus master.

6. The method of claim 1, wherein isolating the CLS comprises closing the bridge between the CLS and the hard logic system.

7. The method of claim 1, wherein the run-time recovery process comprises reading an interconnect register to obtain an offending address, within the CLS, associated with the malformed interconnect response, and logging the offending address into a system log.

8. The method of claim 1, wherein the CLS is configured in accordance with a first binary configuration file, and the run-time recovery process comprises making a determination whether or not a second, different, binary configuration file is accessible by the hard logic system.

9. The method of claim 8, further comprising, when the determination is that the second binary configuration file is accessible, reconfiguring the CLS with the second binary file.

10. The method of claim 8, further comprising, when the determination is that the second binary file is not accessible, safely shutting down the CLS.

11. An electronic circuit for monitoring transactions between a hard logic system and a configurable logic system (CLS), the CLS and the hard logic system being communicatively coupled by a bridge, the circuit being configured to:
receive an exception, the exception indicating that a malformed interconnect response has been output by the CLS;
clear all pending CLS transactions;
isolate the CLS; and
execute a run-time recovery process.

12. The circuit of claim 11, wherein the circuit is configured to receive the exception at an exception handler located in a memory location accessible to the hard logic system irrespective of whether the bridge is open.

13. The circuit of claim 12, wherein the exception handler is located in or proximate to the hard logic system.

14. The circuit of claim 11, wherein the CLS comprises a programmable logic device.

15. The circuit of claim 11, wherein the hard logic system is a bus master.

16. The circuit of claim 11, wherein isolating the CLS comprises closing the bridge between the CLS and the hard logic system.

17. The circuit of claim 11, wherein the run-time recovery process comprises reading an interconnect register to obtain an offending address, within the CLS, associated with the malformed interconnect response, and logging the offending address into a system log.

18. The circuit of claim 11, wherein the CLS is configured in accordance with a first binary configuration file, and the run-time recovery process comprises making a determination whether or not a second, different, binary configuration file is accessible by the hard logic system.

19. The circuit of claim 18, further comprising, when the determination is that the second binary configuration file is accessible, reconfiguring the CLS with the second binary file.

20. The circuit of claim 18, further comprising, when the determination is that the second binary configuration file is not accessible, safely shutting down the CLS.

* * * * *